United States Patent
Usami

(10) Patent No.: US 6,468,898 B1
(45) Date of Patent: Oct. 22, 2002

(54) METHOD OF MANUFACTURING SEMICONDUCTOR DEVICE

(75) Inventor: Tatsuya Usami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/672,303

(22) Filed: Sep. 29, 2000

(30) Foreign Application Priority Data

Sep. 29, 1999 (JP) .......................................... 11-277563

(51) Int. Cl.⁷ ....................... H01L 21/4763; H01L 21/44
(52) U.S. Cl. ...................... 438/638; 438/653; 438/656
(58) Field of Search ............................... 438/618, 622, 438/626, 623, 624, 637, 638, 639, 640, 653, 656

(56) References Cited

U.S. PATENT DOCUMENTS

| 6,197,696 B1 | * | 3/2001 | Aoi ........................... 438/700 |
| 6,291,333 B1 | * | 9/2001 | Lou ........................... 438/618 |
| 2001/0010894 A1 | * | 8/2001 | Shin et al. .................. 430/312 |

FOREIGN PATENT DOCUMENTS

| JP | 7-94490 | 4/1995 |
| JP | 10-284600 | 10/1998 |
| JP | 11-17008 | 1/1999 |
| JP | 11-168105 | 6/1999 |

OTHER PUBLICATIONS

Japanese Office Action dated Mar. 19, 2002, with partial English translation.

* cited by examiner

Primary Examiner—Trung Dang
Assistant Examiner—Brook Kebede
(74) Attorney, Agent, or Firm—McGinn & Gibb, PLLC

(57) ABSTRACT

In removing individual photoresist films used for forming a via hole and an overlying wiring trench, a low dielectric constant film is prevented from being subjected to a plasma ashing treatment, which makes it possible to produce a good quality dual damascene wiring structure. After formation of a metal mask which is WN film on an interlayer insulation film including the low dielectric constant film, a first photoresist film and a second photoresist film are sequentially formed on the WN film, wherein the first photoresist film and the second photoresist film are patterned to to have patterns for forming a via hole and an overlying wiring trench, respectively; then, the WN film is patterned according to a pattern of each of the first photoresist film and the second photoresist film; and, after that, the interlayer insulation film is patterned using the WN film as a mask to form the via hole and the overlying wiring trench in the interlayer insulation film.

21 Claims, 8 Drawing Sheets

15: WN film (metal mask)
4: P-SiO₂ film
1: Cu wiring line (underlying wiring line)
2: P-SiN film
3: organic polymer film 5: first photoresist film 7: second photoresist film 16: concave portion
16A: WN upper film
16B: WN lower film 54: P-SiO₂ film
53: organic polymer film
52: P-SiN film
51: Cu wiring line (underlying wiring line)

55: first photoresist film

56: hole

57: second photoresist film

58: overlying wiring trench

FIG.8A
*(PRIOR ART)*
FIG.8B
*(PRIOR ART)*
FIG.8C
*(PRIOR ART)*
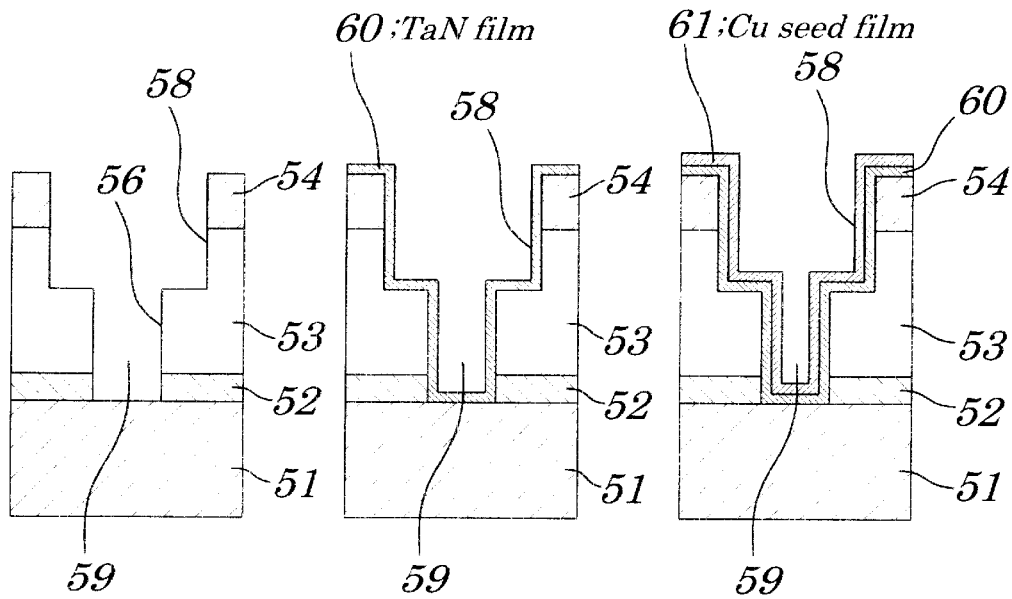
FIG.8D
*(PRIOR ART)*
FIG.8E
*(PRIOR ART)*
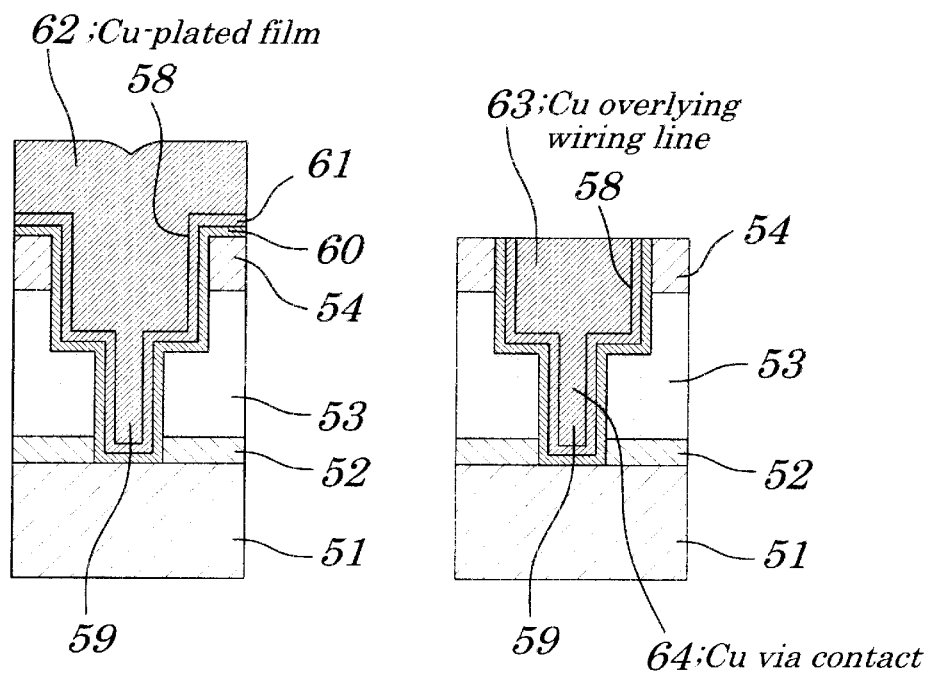

METHOD OF MANUFACTURING SEMICONDUCTOR DEVICE

BACKGROUND OF THE INVENTION

1. Field of the Invention

The present invention relates to a method of manufacturing a semiconductor device, and, more particularly, to the method of manufacturing the semiconductor device provided with a dual damascene wiring structure.

2. Description of the Related Art

In LSI (Large Scale Integrated) circuits such as microprocessors, memories and like, there is substantial incentive toward higher levels of integration density and design rules permitting smaller minimum feature sizes for individual circuit components or devices. In other words, as a semiconductor industry moves toward smaller and smaller device dimensions, a greater density of devices per silicon substrate is required. As device dimensions shrink, each of wires (wiring lines) extending from individual active areas also shrinks in width and in wiring pitch, wherein the wiring pitch is a distance between two adjacent wiring lines. Due to this, these wiring lines are closely packed to increase their wiring density. Further, since the wiring density has increased described above, a so-called "multilevel metallization technology" has been developed and employed, wherein a plurality of layers each of which has a wiring line and a thickness are stacked together into a stack to form a semiconductor device.

In the LSI circuits described above, shrinking of the wiring pitch leads to an increase in interwiring capacitance, which considerably affects particularly a high-speed type of LSI circuits in operation speed. In order to prevent the interwiring capacitance from increasing, it is so devised that an interlayer insulation film formed between two adjacent wiring layers is constructed of a low dielectric constant film. Further, operation speed depends on a wiring resistance. In general, heretofore, wiring materials used in the semiconductor device provided with LSI circuits have been aluminum (Al) or an aluminum-based alloy containing aluminum as its main component, wherein aluminum or the aluminum-based alloy is hereinafter referred to as an aluminum-based metal. However, in order to increase operation speed, it is necessary to use a conductive material which is smaller in electric resistance than the aluminum-based metal.

As a result, copper (Cu) which is smaller in electric resistance than the aluminum-based metal has been widely used in place of the aluminum-based metal.

On an other hand, as one of conventional structures adapted for use with a fine wiring line in a multilevel interconnection, there is known a dual damascene wiring structure. In this dual damascene wiring structure: a Cu underlying wiring line is previously formed on a semiconductor substrate; an interlayer insulation film is then formed on the semiconductor substrate through the Cu underlying wiring line; and, both a via hole and a trench for forming an overlying wiring line (hereinafter referred to as an overlying wiring trench) are formed in the interlayer insulation film and filled with Cu (copper) to form a Cu via contact and a Cu overlying wiring line, respectively; whereby the Cu underlying wiring line is electrically connected with the Cu overlying wiring line through the Cu via contact.

FIGS. 7A–7F and 8A–8E are views showing a series of process steps of a conventional method of manufacturing a semiconductor device provided with the dual damascene wiring structure such as that described above. Hereinbelow, with reference to FIGS. 7A–7F and 8A–8E, the conventional method of manufacturing the semiconductor device will be described in order of its process steps.

First, as shown in FIG. 7A, a Cu wiring line 51 is formed on a semiconductor substrate (not shown) as an underlying wiring line. Formed on the Cu wiring line 51 by a plasma CVD (chemical vapor deposition) process of a parallel flat plate type is a P—SiN (plasma silicon nitride) film 52 which has a film thickness of approximately 50 nm. After formation of the P—SiN film 52, an organic polymer film 53 having a film thickness of approximately 400 nm is formed on the P—SiN film 52 by a spin coating process. Then, in an atmosphere of nitrogen gas, the semiconductor substrate is subjected to a baking process which is performed at a temperature of approximately 400° C. for approximately one hour. After that, a P—SiO$_2$ (plasma silicon oxide) film 54 having a film thickness of approximately 100 nm is formed on the organic polymer film 53 by the plasma CVD process. Here, the P—SiN film 52, the organic polymer film 53 and the P—SiO$_2$ film 54 serve as a Cu diffusion barrier film, a low dielectric constant film and an insulation protective film, respectively. Further, the P—SiN film 52, the organic polymer film 53 and the P—SiO$_2$ film 54 are stacked into a stack to form an interlayer insulation film.

Next, as shown in FIG. 7B, a photoresist is applied to an upper surface of the P—SiO$_2$ film 54 to form a photoresist film on the P—SiO$_2$ film 54. After that, as will be described later, the thus formed photoresist film is patterned to form a first photoresist film 55 which has a pattern for forming a via hole. Then, as shown in FIG. 7C, using the first photoresist film 55 as a mask, a dry etching process is performed to selectively remove the P—SiO$_2$ film 54. Subsequent to this, as shown in FIG. 7D, using the first photoresist film 55 as a mask, a plasma etching process employing an oxygen-based gas is performed to selectively remove the organic polymer film 53 in a manner such that a hole 56 having a width of W1 and forming a part of the via hole is formed. Further, the first photoresist film 55 is removed by an ashing process when the organic polymer film 53 is selectively removed. In other words, the ashing process of the first photoresist film 55 is performed through an anisotropic plasma ashing treatment.

Next, as shown in FIG. 7E, a photoresist is applied to an upper surface of the P—SiO$_2$ film 54 to form a photoresist film on the P—SiO$_2$ film 54. After that, as will be described later, the thus formed photoresist film is patterned to form a second photoresist film 57 which has a pattern for forming an overlying wiring trench for forming an overlying wiring trench 58. Then, as shown in FIG. 7F, using the second photoresist film 57 as a mask, a dry etching process is performed to selectively remove the P—SiO$_2$ film 54. Subsequent to this, using the second photoresist film 57 as a mask, an oxygen plasma etching process is performed to selectively remove the organic polymer film 53 in a manner such that the overlying wiring trench 58 which has a width of W2 (>W1) and is smaller in depth than the hole 56. Further, the second photoresist film 57 is also removed by an ashing process when the organic polymer film 53 is selectively removed, as is in a case of the first photoresist film 55. In other words, the ashing process of the second photoresist film 57 is performed through anisotropic plasma ashing treatment.

Then, as shown in FIG. 8A, by a plasma etching process, the P—SiN film 52 is etched back to selectively expose the Cu wiring line 51. As a result, the hole 56 extends to a top surface of the Cu wiring line 51 thus exposed, so that a via hole 59 is formed. Then, as shown in FIG. 8B, by an ion sputtering process, a TaN (tantalum nitride) film 60 is formed over an entire surface of substrate including both the overlying wiring trench 58 and the via hole 59. After that, as shown in FIG. 8C, by a sputtering process, a Cu seed film 61 having a film thickness of approximately 50 nm is formed on the TaN film 60.

Next, as shown in FIG. 8D, by a plating process, a Cu-plated film 62 having a film thickness of approximately 800 nm is formed on the Cu seed film 61. After that, as shown in FIG. 8E, the Cu-plated film 62, the Cu seed film 61 and the TaN film 60, all of which are formed above a top surface of the P—$SiO_2$ film 54, are removed by a CMP (chemical mechanical polishing) process, so that the top surface of the P—$SiO_2$ film 54 is planarized to complete a dual damascene wiring structure, in which structure both the overlying wiring trench 58 and the via hole 59 are filled with the Cu-plated film 62.

The following problem is inherent in the conventional method of manufacturing the semiconductor device.

Namely, in the conventional method: when the photoresist films having been used in forming the via hole and the overlying wiring trench are removed, the low dielectric constant film is subjected to the anisotropic plasma ashing treatment, which tends to produce residue of the photoresist films. Such residue raises the problem inherent in the conventional method.

More specifically: as shown in FIG. 7D, by the plasma etching process using the oxygen-based gas, when the organic polymer film 53 forming the low dielectric constant film is selectively removed at a time when the first photoresist film 55 is removed; and, further, as shown in FIG. 7F, by the plasma etching process using the oxygen-based gas, when the organic polymer film 53 forming the low dielectric constant film is selectively removed at a time when the second photoresist film 57 is removed, the residue of each of the first photoresist film 55 and second photoresist film 57 is apt to be produced. The thus produced residue affects the remaining processes subsequent to the plasma etching processes, which makes it difficult to produce a good quality dual damascene structure.

In order to prevent the residue of each of the first photoresist film 55 and second photoresist film 57 from being produced, each of the first photoresist film 55 and second photorsist film 57 is subjected to an over-ashing process so that substantially all of the first photoresist film 55 and second photoresist film 57 are removed from the substrate. However, such removal of the first photoresist film 55 and second photoresist film 57 tends to deform each of the via hole 59 and the overlying wiring trench 58. Due to this, it is disadvantageous to perform such over-ashing process.

Further, in removing each of the first photoresist film 55 and second photoresist film 57, it is effective to perform an isotropic plasma ashing treatment in place of the anisotropic plasma ashing treatment. However, the isotropic plasma ashing treatment is also problematic since it suffers from the above-mentioned disadvantages.

SUMMARY OF THE INVENTION

In view of the above, it is an object of the present invention to provide a method of manufacturing a semiconductor device, wherein: when a plurality of photoresist films each used for forming each of a via hole and an overlying wiring trench are removed, a good quality dual damascene wiring structure is formed by preventing a low dielectric constant film from being subjected to a plasma ashing treatment.

According to a first aspect of the present invention, there is provided a method of manufacturing a semiconductor device in which an underlying wiring line made of copper or a conductive material containing copper as its main component is formed in a semiconductor substrate; after that, an interlayer insulation film including a low dielectric constant film is formed on the semiconductor substrate; an overlying wiring trench and a via hole are formed in the interlayer insulation film; and, the overlying wiring trench and the via hole are filled with copper or a conductive material containing copper as its main component to form an overlying wiring line and a via contact, the method including the steps of:

forming a metal mask on the interlayer insulation film;

subsequently forming a first photoresist film and a second photoresist film on the metal mask, wherein the first photoresist film and the second photoresist film are patterned to form the via hole and the overlying wiring trench, respectively;

patterning the metal mask according to a pattern of each of the first photoresist film and the second photoresist film; and removing the first photoresist film and the second photoresist film prior to patterning of the interlayer insulation film, wherein the patterning is performed using the metal mask to form the via hole and the overlying wiring trench in the interlayer insulation film.

Also, according to a second aspect of the present invention, there is provided a method of manufacturing a semiconductor device in which an underlying wiring line made of copper or a conductive material containing copper as its main component is formed in a semiconductor substrate; after that, an interlayer insulation film including a low dielectric constant film is formed on the semiconductor substrate; an overlying wiring trench and a via hole are formed in the interlayer insulation film; and, the overlying wiring trench and the via hole are filled with copper or a conductive material containing copper as its main component to form an overlying wiring line and a via contact, the method including:

a metal mask forming step for forming a metal mask on the interlayer insulation film;

a first photoresist film forming step for forming a first photoresist film on the metal mask, the first photoresist film having been patterned to have a pattern for forming the via hole;

a first photoresist film removing step for removing the first photoresist film by an isotropic plasma ashing treatment after the metal mask is patterned to have a same pattern as that of the first photoresist film;

a second photoresist film forming step for forming a second photoresist film on the metal mask, the second photoresist film having been patterned to have a pattern for forming the overlying wiring trench;

a second photoresist film removing step for removing the second photoresist film by the isotropic plasma ashing treatment after the metal mask is patterned to have a same pattern as that of the second photoresist film; and an interlayer insulation film patterning step for sequentially patterning the interlayer insulation film by using the metal mask to sequentially form the via hole and the overlying wiring trench.

Also, according to a third aspect of the present invention, there is provided a method of manufacturing a semiconductor device in which an underlying wiring line made of copper or a conductive material containing copper as its main component is formed in a semiconductor substrate; after that, an interlayer insulation film including a low dielectric constant film is formed on the semiconductor substrate; an overlying wiring trench and a via hole are formed in the interlayer insulation film; and, the overlying wiring trench and the via hole are filled with copper or a conductive material containing copper as its main component to form an overlying wiring line and a via contact, the method including:

- a metal mask forming step for forming a metal mask on the interlayer insulation film, the metal mask being constructed of a multilayered element, the multilayered element having a first metal mask and a second metal mask;
- a first photoresist film forming step for forming a first photoresist film on the metal mask, the first photoresist film having been patterned to have a pattern for forming the via hole;
- a first photoresist film removing step for removing the first photoresist film by an isotropic plasma ashing treatment after the first metal mask and the second metal mask are patterned to have a same pattern as that of the first photoresist film;
- a second photoresist film forming step for forming a second photoresist film on the metal mask, the second photoresist film having been patterned to have a pattern for forming the overlying wiring trench;
- a second photoresist film removing step for removing the second photoresist film by an isotropic plasma ashing treatment after the second metal mask of the metal mask is patterned to have a same pattern as that of the second photoresist film; and
- an interlayer insulation film patterning step for sequentially patterning the interlayer insulation film by using the metal mask to sequentially form the via hole and the overlying wiring trench.

In the foregoing second aspect or third aspect, a preferable mode is one wherein the interlayer insulation film is formed through: a first step for forming a Cu diffusion barrier film on the underlying wiring line; a second step for forming the low dielectric constant film on the Cu diffusion barrier film; and, a third step for forming an insulation protective film on the low dielectric constant film.

Also, a preferable mode is one wherein the metal mask is made of a material selected from a group consisting of: tungsten nitride; tantalum; tungsten; tantalum nitride; titanium; titanium nitride; and, tungsten silicide.

Also, a preferable mode is one wherein the Cu diffusion barrier film is made of a material selected from a group consisting of: plasma silicon nitride; and, plasma silicon carbide.

Further, a preferable mode is one wherein the low dielectric constant film is made of a material selected from a group consisting of: organic polymer; HSQ (Hydrogen Silsesquioxane); organic SOG (Spin on Glass); and, porous silica.

Still further, a preferable mode is one wherein, the insulation protective film is made of a material selected from the group consisting of: plasma silicon oxide; plasma silicon nitride; plasma silicon oxynitride; and, plasma silicon carbide.

With the above first aspect and second aspect, after formation of the metal mask on the interlayer insulation film including the low dielectric constant film, the first photoresist film and the second photoresist film are sequentially formed on the metal mask, wherein the first photoresist film and the second photoresist film are patterned to have patterns for forming the via hole and the overlying wiring trench, respectively; then the metal mask is patterned according to a pattern of each of the first and the second photoresist film; and, after that, the interlayer insulation film is patterned using the metal mask to form the via hole and the overlying wiring trench in the interlayer insulation film. Consequently, in patterning the interlayer insulation film, it is possible not to use the first photoresist film and the second photoresist film.

Also, with the configuration of the above third aspect, the metal mask constructed of the multilayered element having the first metal mask and the second metal mask is formed on the interlayer insulation film including the low dielectric constant film; then, the first photoresist film and the second photoresist film are sequentially formed on the metal mask, wherein the first photoresist film has been patterned to have a pattern for forming the via hole, and second photoresist film has been patterned to have a pattern for forming the overlying wiring trench; after that, the interlayer insulation film is patterned using the multilayered element to sequentially form the via hole and the overlying wiring trench. Consequently, it is possible not to use the first photoresist film and the second photoresist film in patterning the interlayer insulation film.

As a result, when individual photoresist films having been used to form the via hole and the overlying wiring trench are removed, it is possible to prevent the low dielectric constant film from being subjected to the plasma ashing treatment, which makes it possible for the method of the present invention to produce the high quality dual damascene structure.

BRIEF DESCRIPTION OF THE DRAWINGS

The above and other objects, advantages and features of the present invention will be more apparent from the following description taken in conjunction with the accompanying drawings in which:

FIGS. 8A–8E are a series of sectional views of the semiconductor substrate, illustrating process steps of the conventional method.

DETAILED DESCRIPTION OF THE PREFERRED EMBODIMENTS

Figure 1A:
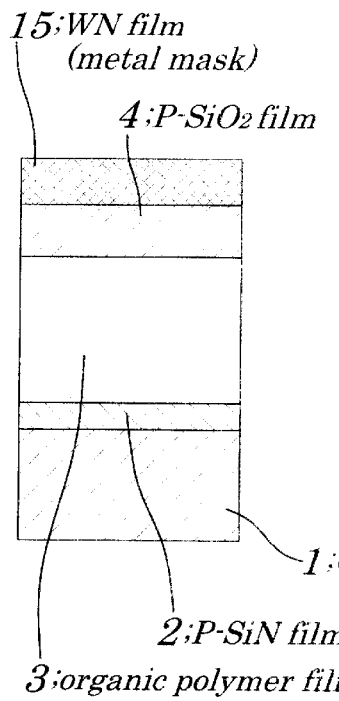
FIGS. 1A–1F are a series of sectional views of a semiconductor substrate, illustrating process steps of a method of a first embodiment of the present invention for manufacturing a semiconductor device, followed by process steps shown in FIGS. 2A–2F.

The best modes for carrying out the present invention will be described in detail using a plurality of embodiments with reference to the accompanying drawings.

In the accompanying drawings, thickness of films and regions are exaggerated for clarity. Like reference numerals refer to like parts throughout the accompanying drawings.

Incidentally, it will also be understood that when a film is referred to as being "on" another film or substrate, it can be directly on such another film or substrate, or intervening films may also be present therebetween.

First Embodiment

FIGS. 1A–1F, 3A and 3B show a series of process steps of a first embodiment of a method of the present invention for manufacturing a semiconductor device, wherein the process steps are performed in order of process steps shown in the drawings.

Now, with reference to FIGS. 1A–1F, 2A–2F, 3A and 3B, the method of the present invention will be described in the order of the process steps of the method.

First, as shown in FIG. 1A, a Cu (copper) wiring line 1, which serves as an underlying wiring line, is formed on a semiconductor substrate (not shown). Formed on the Cu wiring line 1 by a plasma CVD process is a P—SiN film 2 which has a film thickness of approximately 50 nm. After formation of the P—SiN film 2, an organic polymer film 3 having a film thickness of approximately 800 nm is formed on the P—SiN film 2 by a spin coating process. Then, in an atmosphere of nitrogen gas, a baking treatment is performed at a temperature of approximately 400° C. for approximately one hour. Subsequent to this, by a same plasma CVD process, a P—SiO$_2$ film 4 has a film thickness of approximately 100 nm is formed on the organic polymer film 3. Here, the P—SiN film 2 is used as a Cu diffusion barrier film. The organic polymer film 3 is used as a low dielectric constant film. The P—SiO$_2$ film 4 is used as an insulation protective film. Further, the P—SiN film 2, organic polymer film 3 and the P—SiO$_2$ film 4 are stacked together to form a multilayered film which forms an interlayer insulation film.

Then, by a sputtering process, a WN (tungsten nitride) film 15 having a film thickness of approximately 50 nm and serving as a metal mask is formed on the P—SiO$_2$ film 4.

Figure 1B:
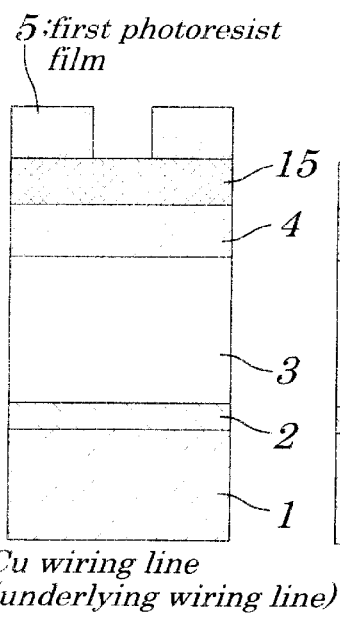

Next, as shown in FIG. 1B, using a first photoresist film 5 as a mask, the WN film 15 is patterned by a dry etching process with use of a chlorine-based gas so as to be selectively removed in a manner such that the WN film 15 has a same pattern as that of the first photoresist film 5.

Figure 1C:
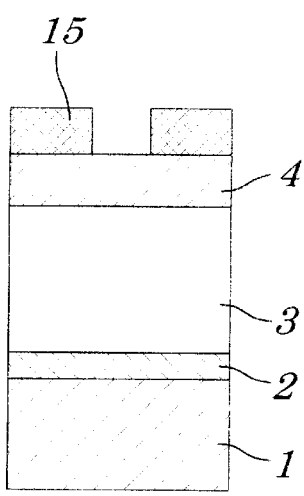

Then, as shown in FIG. 1C, by an isotropic oxygen plasma ashing treatment, the first photoresist film 5 is removed because the pattern of the first photoresist film 5 has been already transferred to the WN film 15 and therefore the first photoresist film 5 is no longer required. As described above, by removing the photoresist film 5 through the isotropic oxygen plasma ashing treatment, it is possible to prevent residue of the photoresist film 5 from being produced. Furthermore, as for the isotropic oxygen plasma ashing treatment, it is possible to perform this isotropic plasma ashing treatment without subjecting the organic polymer film 3 (which is a low dielectric constant film) to the isotropic ashing treatment.

Figure 1D:
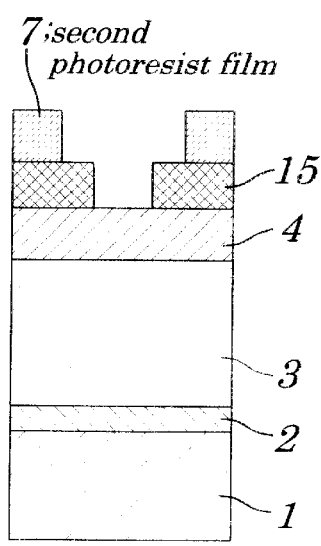

After that, as shown in FIG. 1D, a photoresist is applied to a top surface of the WN film 15 to form a second photoresist film 7. This second photoresist film 7 is then patterned to have a pattern for forming an overlying wiring trench.

Figure 1E:
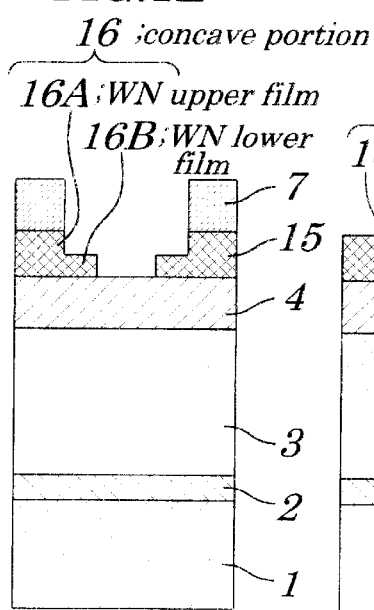

Then, as shown in FIG. 1E, using the second photoresist film 7 as a mask, a dry etching process with use of a chloride-based gas is performed in a manner such that the WN film 15 is selectively removed up to a substantially midpoint of its film thickness to assume a same shape in cross section as that of the pattern of the second photoresist film 7, whereby a concave portion 16 is formed in the WN film 15. As is clear from FIG. 1E, this concave portion 16 is constructed of: a WN upper film 16A having been patterned to have a pattern for forming the overlying wiring trench, wherein the WN upper film 16A has a large diameter opening; and, a WN lower film 16B having been patterned to have a pattern for forming a via hole, wherein the WN lower film 16B has a small diameter opening and is smaller in opening diameter than the WN upper film 16A.

Figure 1F:
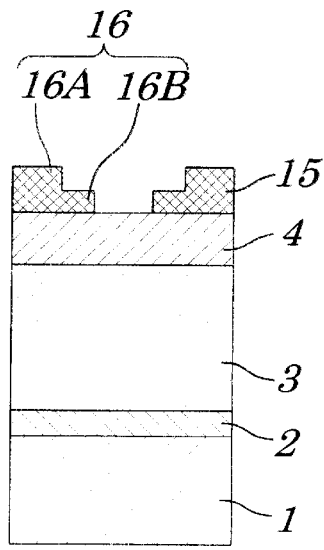

Next, as shown in FIG. 1F, by the isotropic oxygen plasma ashing treatment, the second photoresist film 7 is removed, because the pattern of the second photoresist film 7 has been already transferred to the WN film 15 and therefore the second photoresist film 7 is no longer required. As described above, by removing the photoresist film 7 through the isotropic oxygen plasma ashing treatment, it is possible to prevent residue of the photoresist film 7 from being produced as is in a case of the first photoresist film 5. Furthermore, as for the isotropic oxygen plasma ashing treatment, it is possible to perform this isotropic plasma ashing treatment without subjecting the organic polymer film 3 to the ashing treatment.

Figure 2A:
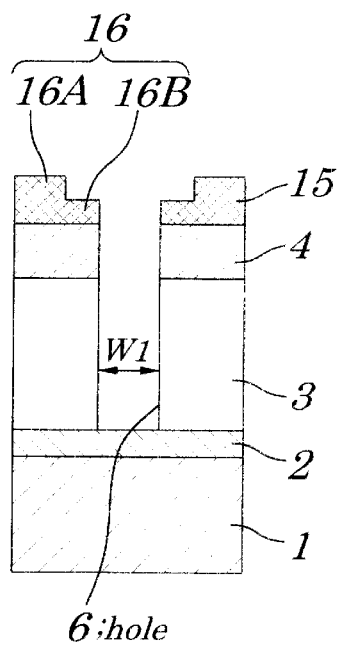
FIGS. 2A–2F are a series of sectional views of the semiconductor substrate, illustrating process steps of the method of the first embodiment, followed by process steps shown in FIGS. 3A and 3B.

After that, as shown in FIG. 2A, using the WN film 15 as a mask, a dry etching process is performed so that the P—SiO$_2$ film 4 is selectively removed. Then, using the WN film 15 as a mask, a dry etching process is performed with use of an oxygen-based etching gas, so that the organic polymer film 3 is selectively removed to have a same pattern as that of the WN lower film 16B, whereby a hole 6 which forms a part of the via hole and has a width of W1 is formed.

In this process step, the WN film 15 which is a metal mask assumes a same role as that of the first photoresist film 5 having been removed as described above.

Figure 2B:
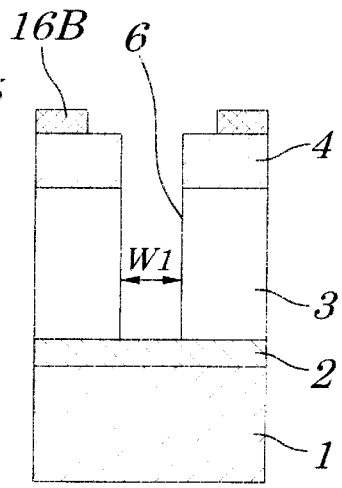

Then, as shown in FIG. 2B, the WN film 15 is etched back by a dry etching process with use of the chloride-based gas, so that the WN upper film 16A of the concave portion 16 is removed. Due to this, only the WN lower film 16B remains on a top surface of the P—SiO$_2$ film 4. As is clear from FIG. 2B, the WN lower film 16B has a large-diameter opening pattern for forming overlying wiring trench 8.

Figure 2C:
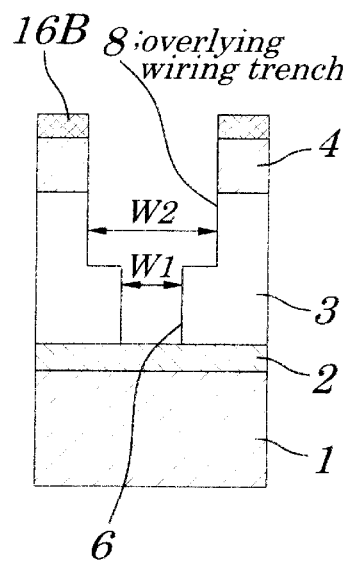

After that, as shown in FIG. 2C, using the WN lower film 16B as a mask, a dry etching process is performed to selectively remove the P—SiO$_2$ film 4. Subsequent to this, using the WN lower film 16B as a mask, a dry etching process is performed with the use of an oxygen-based etching gas to selectively remove the organic polymer film 3 in a manner such that the organic polymer film 3 has a same pattern as that of the WN lower film 16B which has the large-diameter opening pattern, whereby the overlying wiring trench 8 which has a width of W2 (>W1) and is smaller in depth than a hole 6 is formed.

In this process step, the WN lower film 16B assumes same role as that of the second photoresist film 7 having been removed as described above.

Figure 2D:
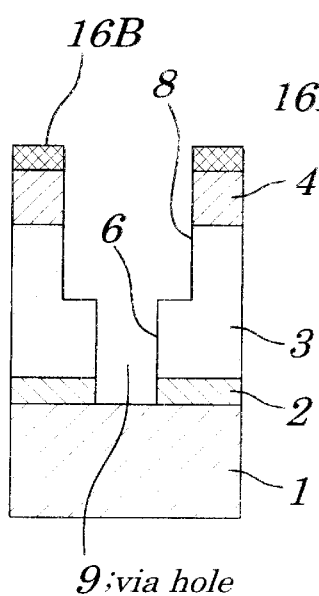

Then, as shown in FIG. 2D, the P—SiN film 2 is etched back by a plasma etching process to partially expose the Cu wiring line 1. Due to this, the hole 6 extends to a top surface of the Cu wiring line 1 so that a via hole 9 is completed.

Figure 2E:
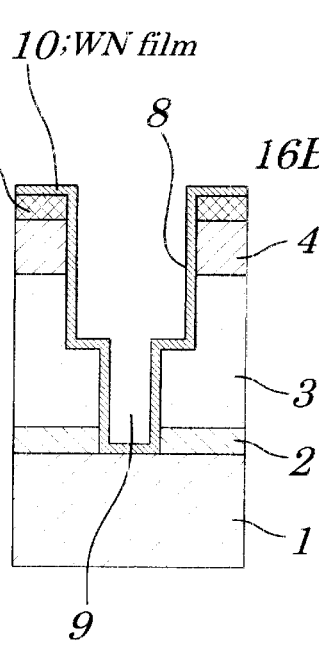

Next, as shown in FIG. 2E, by an ion sputtering process, another WN (tungsten nitride) film 10 is formed over an entire surface of the substrate including the overlying wiring trench 8 and the via hole 9 to serve as a Cu diffusion barrier film.

Figure 2F:
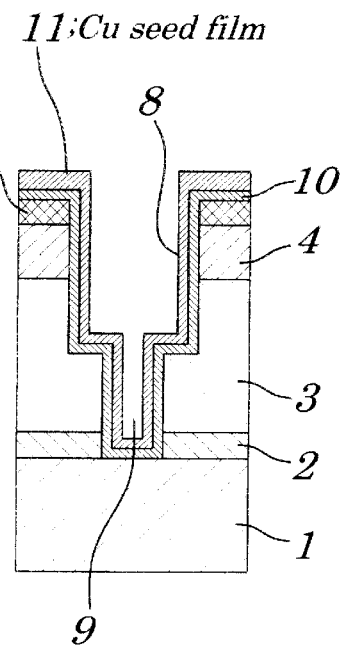
Figure 3A:
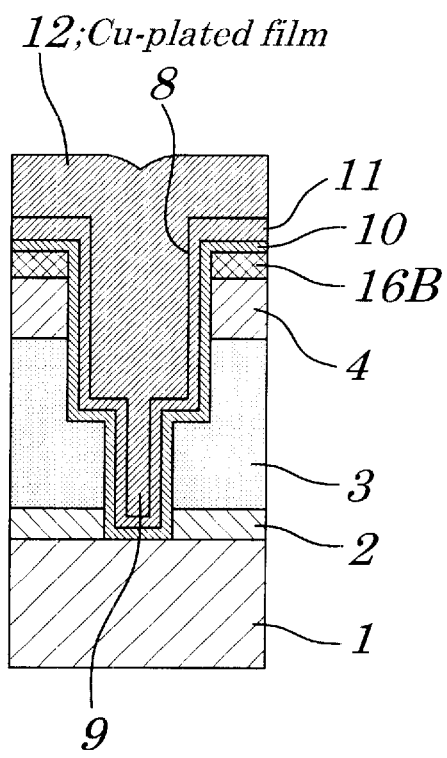
FIGS. 3A and 3B are a series of sectional views of the semiconductor substrate, illustrating process steps of the method of the first embodiment.

Then, as shown in FIG. 2F, by a sputtering process, a Cu seed film 11 having a film thickness of approximately 50 nm is formed on the WN film 10. After that, as shown in FIG. 3A, by a plating process, a Cu-plated film 12 having a film thickness of approximately 800 nm is formed on the Cu seed film 11.

Figure 3B:
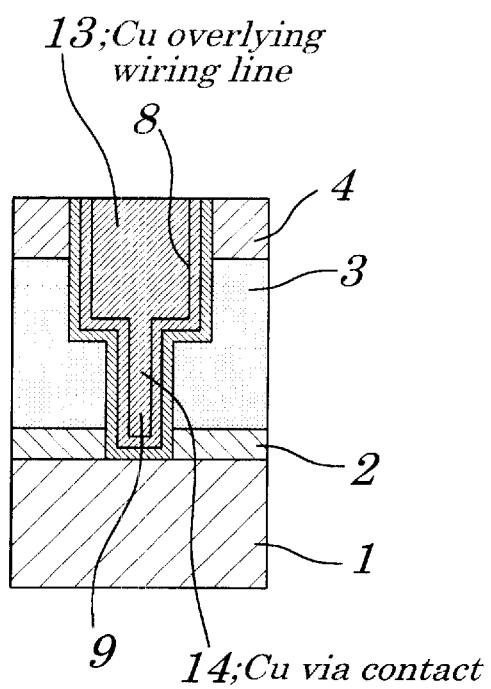

Next, as shown in FIG. 3B, by a CMP process, the Cu-plated film 12, the Cu seed film 11, the WN film 10 and the WN lower film 16B all formed over the top surface of the P—$SiO_2$ film 4 are removed to planarize the top surface of the P—$SiO_2$ film 4. As a result, the overlying wiring trench 8 and the via hole 9 are filled with the Cu-plated film 12, so that a Cu overlying wiring line 13 and a Cu via contact 14 are completed, which leads to completion of formation of a good quality dual damascene wiring structure. The dual damascene wiring structure thus completed has a construction corresponding to that shown in FIG. 8E.

As described above, in the first embodiment having the above construction, the WN film 15, which serves as a metal mask, is formed on the interlayer insulation film including the low dielectric constant film. After that, sequentially formed on this WN film 15 are: the first photoresist film 5 which is patterned to have a pattern for forming the via hole 9; and, the second photoresist film 7 which is patterned to have a pattern for forming the overlying wiring trench 8. Then, the WN film 15 is patterned according to patterns of the first photoresist film 5 and the second photoresist film 7. After that, using this WN film 15 as a mask, the interlayer insulation film is patterned to have the via hole 9 and the overlying wiring trench 8. Consequently, in pattering the interlayer insulation film, the first photoresist film 5 and the second photoresist film 7 are no longer required.

As a result, in removing individual photoresist films used for forming the overlying wiring trench 8 and the via hole 9, it is possible not to subject the low dielectric constant film to the plasma ashing treatment, which ensures that a good quality dual damascene wiring structure is formed.

Second Embodiment

FIGS. 4A–4F, 5A–5F, 6A and 6B show a series of process steps of a second embodiment of a method of the present invention for manufacturing a semiconductor device, wherein the process steps are performed in order of the process steps shown in drawings. In construction, the second embodiment considerably differs from the first embodiment in that: a metal mask used in the second embodiment is constructed of two kinds of metals, wherein the metals are stacked together. Hereinbelow, with reference to FIGS. 4A–4F, 5A–5F, 6A and 6B, the second embodiment will be described in the order of the process steps shown in the drawings.

Figure 4A:
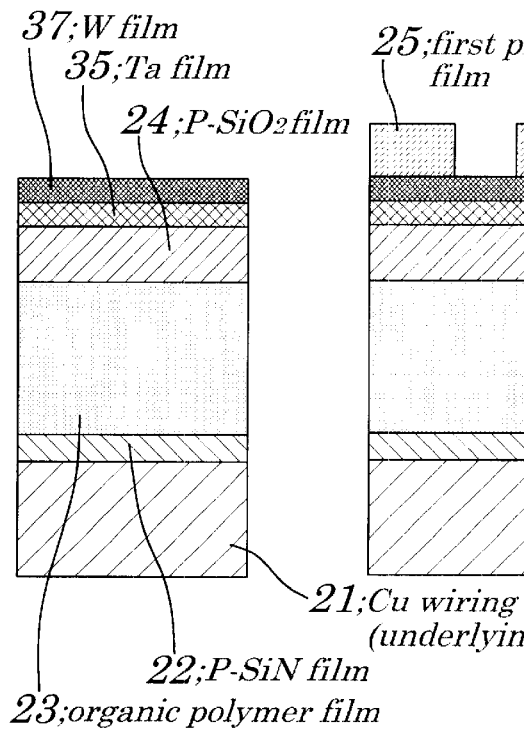
FIGS. 4A–4F are a series of sectional views of a semiconductor substrate, illustrating process steps of a method of a second embodiment of the present invention, followed by process steps shown in FIGS. 5A–5F.

First, as shown in FIG. 4A, a Cu wiring line 21 serving as an underlying wiring line is formed on a top surface of a semiconductor substrate (not shown). Formed on the Cu wiring line 21 by a plasma CVD process is a P—SiN film 22 having a film thickness of approximately 50 nm. After formation of the P—SiN film 22, an organic polymer film 23 having a film thickness of approximately 800 nm is formed on the P—SiN film 22 by a spin coating process. Then, in an atmosphere of nitrogen gas, a baking treatment is performed at a temperature of approximately 400° C. for approximately one hour. After that, a P—$SiO_2$ film 24 having a film thickness of approximately 100 nm is formed on the organic polymer film 23 by a same plasma CVD process. Here, the P—SiN film 22, the organic polymer film 23 and the P—$SiO_2$ film 24 serve as a Cu diffusion barrier film, a low dielectric constant film and a insulation protective film, respectively. Further, the P—SiN film 22, the organic polymer film 23 and the P—$SiO_2$ film 24 are stacked together to form a multilayered film which forms an interlayer insulation film.

Then, by a sputtering process, sequentially formed on the P—$SiO_2$ film 24 are: a Ta (tantalum) film 35, which has a film thickness of approximately 100 nm and serves as a first metal mask; and, a W (tungsten) film 37, which has a film thickness of approximately 100 nm and serves as a second metal mask. As described above, in the second embodiment, the Ta film 35 and the W film 37 are stacked together to form the metal mask.

Figure 4B:
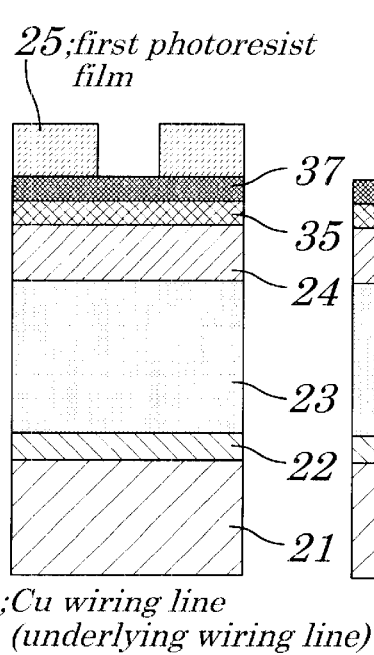

After that, as shown in FIG. 4B, a photoresist is applied to a top surface of the W film 37 to form a first photoresist film 25 which is then patterned to have a pattern for forming a via hole 29, as will be described later.

Figure 4C:
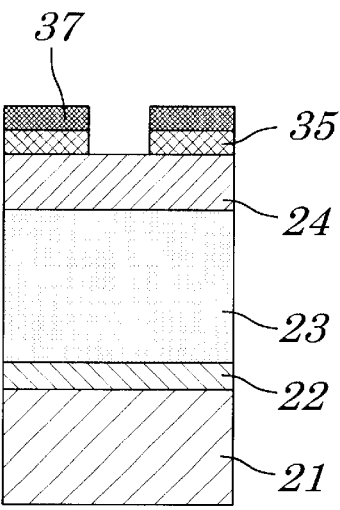

Next, as shown in FIG. 4C, using the first photoresist film 25 as a mask, the W film 37 and the Ta film 35 are selectively removed by a dry etching process with use of a chloride-based gas, so that a same pattern as that of the first photoresist film 25 is formed in each of the W film 37 and the Ta film 35.

Then, the first photoresist film 25 is removed through both an isotropic oxygen plasma ashing treatment and a wet treatment, because the pattern of the first photoresist film 25 has been already transferred to each of the W film 37 and the Ta film 35 and therefore the first photoresist film 25 is no longer required. As described above, by removing the photoresist film 25 by the isotropic plasma ashing treatment, it is possible to prevent residue of the first photoresist film 25 from being produced. Furthermore, as for the isotropic oxygen plasma ashing treatment, it is possible to perform the isotropic oxygen plasma ashing treatment without subjecting the organic polymer film 23 (which is a low dielectric constant film) to the plasma ashing treatment.

Figure 4D:
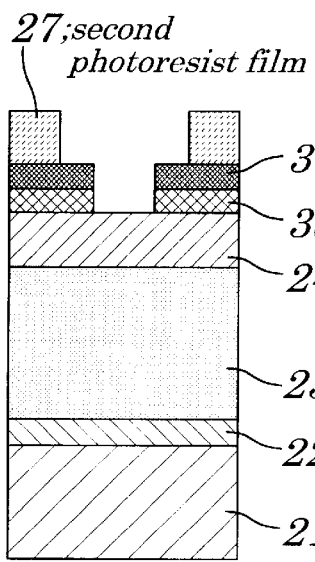

Next, as shown in FIG. 4D, a photoresist is applied to the top surface of the W film 37 to form a second photoresist film 27. After that, the second photoresist film 27 is patterned to have a pattern for forming an overlying wiring trench 28, as will be described later.

Figure 4E:
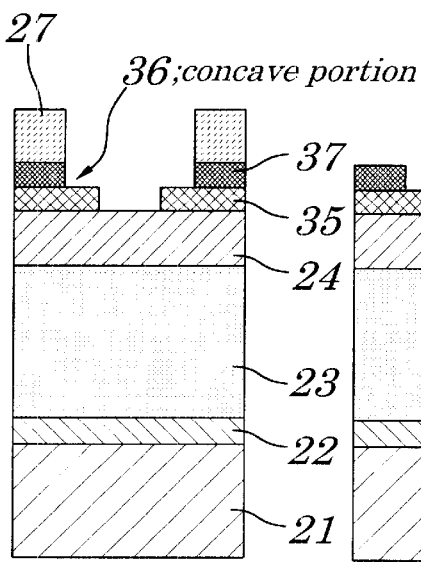

Subsequent to the above, as shown in FIG. 4E, using the second photoresist film 27 as a mask, the W film 37 is selectively removed by a dry etching process to have a same pattern as that of the second photoresist film 27. As a result, a concave portion 36 is formed. This dry etching process is performed in an etching condition in which the W film 37 is preferentially removed relative to the Ta film 35. The concave portion 36 thus formed is constructed of the W film 37 having been patterned to have the pattern for forming the overlying wiring trench 28, wherein the pattern assumes a large-diameter opening shape; and, the Ta film 35 having been patterned to have the pattern for forming the via hole 29, wherein the pattern assumes a small-diameter opening shape which is smaller in diameter than the large-diameter opening of the pattern of the W film 37.

Figure 4F:
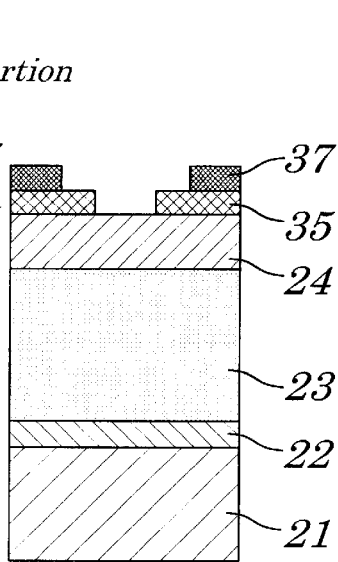

Then, as shown in FIG. 4F, the second photoresist film 27 is removed through an isotropic oxygen plasma ashing treatment and a wet treatment, because the pattern of the second photoresist film 27 has been already transferred to the W film 37 and therefore the second photoresist film 27 is no longer required. As described above, by removing the second photoresist film 27 by the isotropic plasma ashing treatment, it is possible to prevent residue of the second photoresist film 27 from being produced, as is in a case of the first photoresist film 25. Furthermore, as for the isotropic oxygen plasma ashing treatment, it is possible to perform the isotropic oxygen plasma ashing treatment without subjecting the organic polymer film 23 (which is a low dielectric constant film) to the plasma ashing treatment, as is in the case of the first photoresist film 25.

Figure 5A:
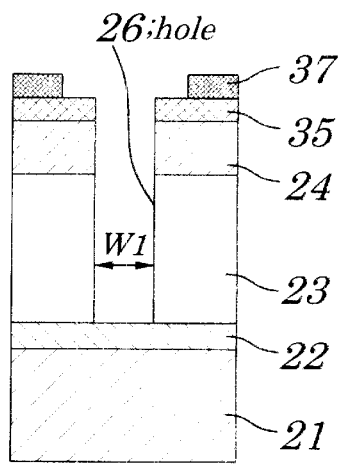
FIGS. 5A–5F are a series of sectional views of the semiconductor substrate, illustrating process steps of the method of the second embodiment, followed by process steps shown in FIGS. 6A and 6B.

Next, as shown in FIG. 5A, using the Ta film 35 as a mask, P—SiO$_2$ film 24 is selectively removed by a dry etching process. After that, further using the Ta film 35 as a mask, the organic polymer film 23 is selectively removed by a dry etching process with use of an oxygen-based gas. As a result, each of the Ta film 35 and the organic polymer film 23 has a same pattern as that of the Ta film 35, so that a hole 26 forming a part of the via hole 29 and having a width of W1 is formed.

Figure 5B:
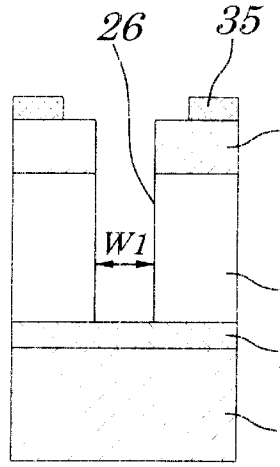

After that, as shown in FIG. 5B, using the W film 37 as a mask, the Ta film 35 is selectively removed by a dry etching process in an etching condition in which the Ta film 35 is preferentially removed relative to the P—SiO$_2$ film 24. Then, the W film 37 is removed by a dry etching process. The Ta film 35 remains in a condition in which the Ta film 35 has been patterned to have a pattern for forming the overlying wiring trench 28, wherein the pattern assumes a large-diameter opening shape.

Figure 5C:
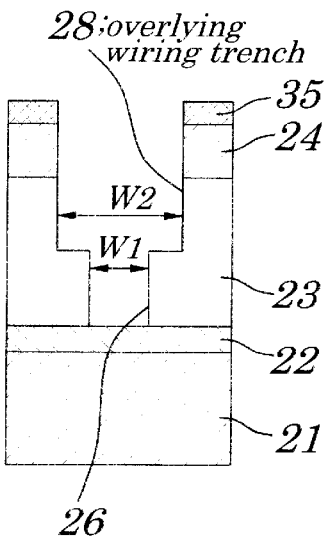

After that, as shown in FIG. 5C, using the Ta film 35 as a mask, the P—SiO$_2$ film 24 is selectively removed by a dry etching process. Then, using a same Ta film 35 as a mask, the organic polymer film 23 is selectively removed by a dry etching process with use of an oxygen-based etching gas. As a result, an overlying wiring trench 28, which is smaller in depth than the hole 26 and has a width of W2 (>W1), is formed.

Figure 5D:
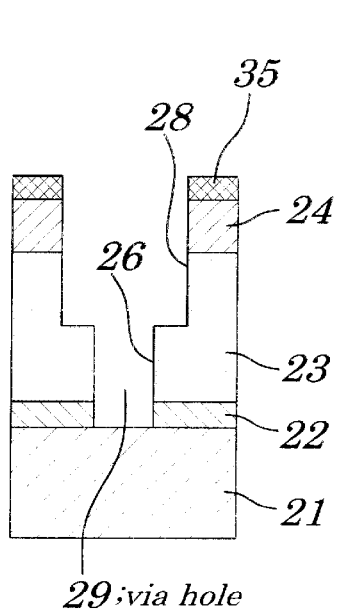

Then, as shown in FIG. 5D, the P—SiN film 22 is etched back by a plasma etching process in a manner such that the Cu wiring line 21 is partially exposed. Due to this, the hole 26 is extended to a top surface of the Cu wiring line 21 so that the via hole 29 is completed.

Figure 5E:
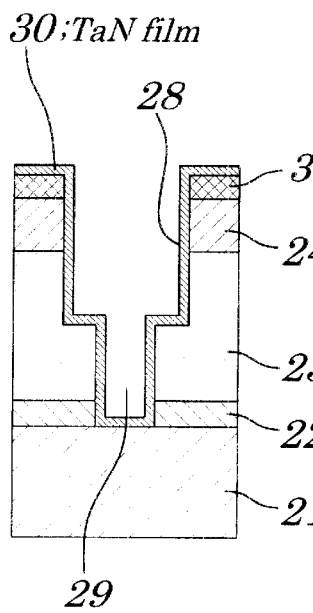

Subsequent to this, as shown in FIG. 5E, by an ion sputtering process, a TaN (tantalumnitride) film 30 serving as a Cu diffusion barrier film is formed over an entire surface of substrate including the overlying wiring trench 28 and the via hole 29.

Figure 5F:
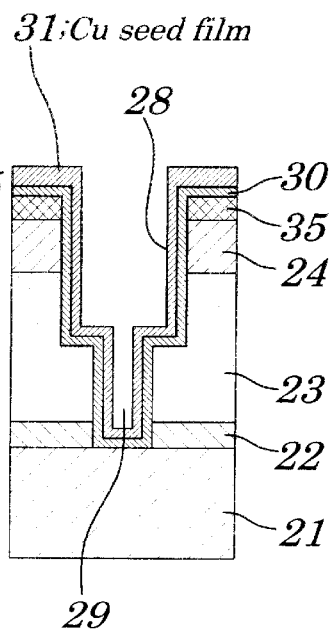
Figure 6A:
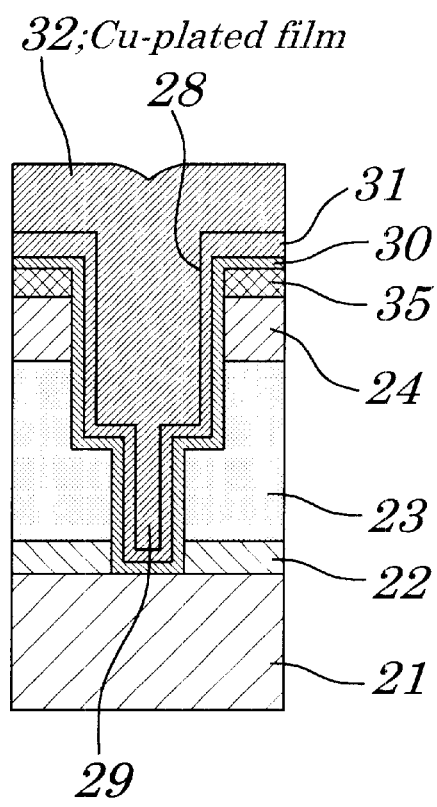
FIGS. 6A and 6B show a series of process steps of the second embodiment.

Next, as shown in FIG. 5F, by a sputtering process, a Cu seed film 31 having a film thickness of approximately 50 nm is formed on the TaN film 30. After that, as shown in FIG. 6A, by a plating process, a Cu-plated film 32 having a film thickness of approximately 800 nm is formed on the Cu seed film 31.

Figure 6B:
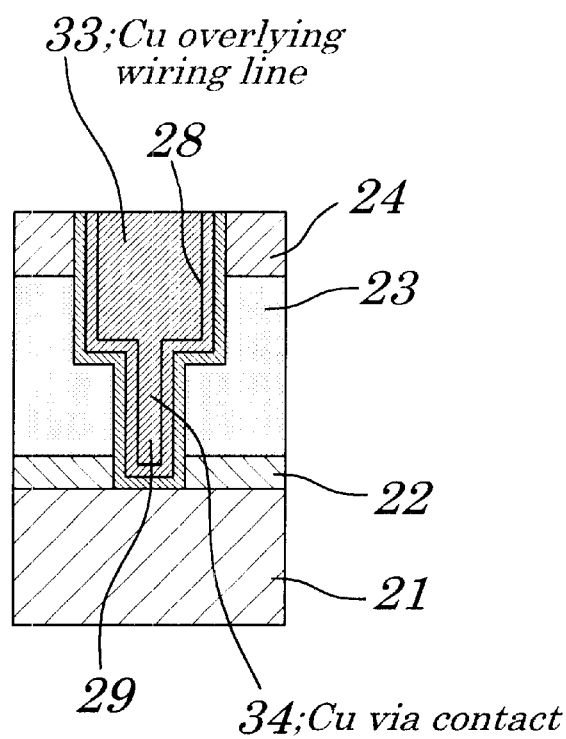
Figure 7A:
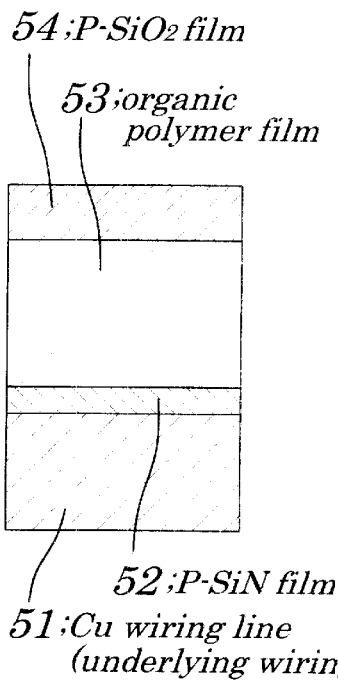
FIGS. 7A–7F are a series of sectional views of a semiconductor substrate, illustrating process steps of a conventional method of manufacturing a semiconductor device, followed by conventional process steps shown in FIGS. 8A–8E.
Figure 7B:
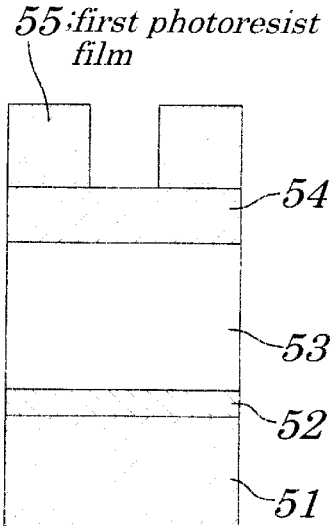
Figure 7C:
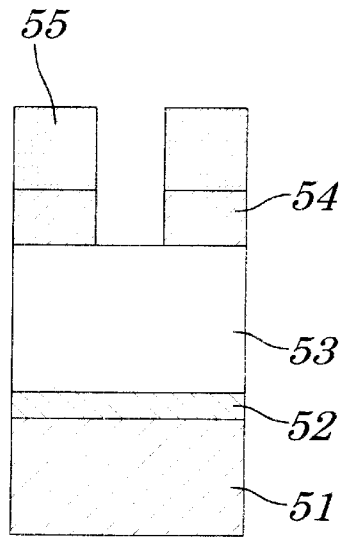
Figure 7D:
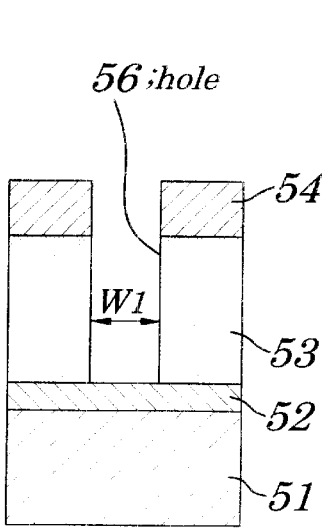
Figure 7E:
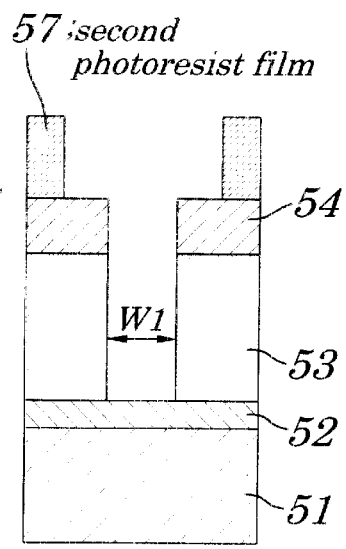
Figure 7F:
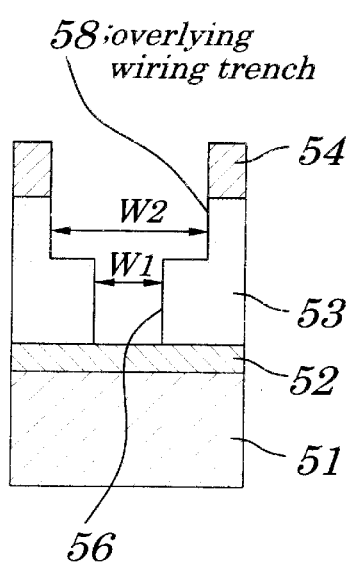

Then, as shown in FIG. 6B, the Cu-plated film 32, the Cu seed film 31, the TaN film 30 and the Ta film 35 all of which are formed over a top surface of the P—SiO$_2$ film 24 are removed by a CMP process, so that a top surface of the Ta film 35 is planarized. As a result, the overlying wiring trench 28 and the via hole 29 are filled with the Cu-plated film 32 so that a Cu overlying wiring line 33 and a Cu via contact 34 are formed, whereby a good quality dual damascene wiring structure is completed. The thus completed dual damascene wiring structure has a same construction as that of the first embodiment shown in FIG. 3B.

As described above, in the second embodiment having the above construction, the metal mask constructed of a multilayered element having the Ta film 35 and the W film 37 is used in place of the WN film 15 used in the first embodiment. As a result, sequentially formed on the W film 37 are: a first photoresist film 25 which is patterned to have a pattern for forming the via hole 29; and, a second photoresist film 27 which is patterned to have a pattern for forming the overlying wiring trench 28. In other words, the Ta film 35 is patterned to have substantially a same pattern as that of the first photoresist film 25, while the W film 37 is patterned to have substantially a same pattern as that of the second photoresist film 27. After that, using the multilayered element as a mask, a patterning process is performed in a manner such that the via hole 29 and the overlying wiring trench 28 are formed in an interlayer insulation film including a low dielectric constant film. Consequently, in this patterning process, both the first photoresist film 25 and the second photoresist film 27 are no longer required.

As is clear from the above, also in the second embodiment having the above construction, it is possible to enjoy a same effect as that obtained in the first embodiment.

In addition, in the second embodiment, since the metal mask which is constructed of a multilayered element composed of two kinds of metals is used, and, further, since the metal mask can be patterned to have a desired pattern through a selective etching process, it is easy to perform patterning operation of the metal mask.

It is apparent that the present invention is not limited to the above embodiments but may be changed and modified without departing from the scope and spirit of the invention. For example, though the dual damascene wiring structure in each of the embodiments of the present invention has been described as a two-layered wiring structure, it is also possible to form a multilayered wiring structure in place of the two-layered wiring structure, in which multilayered wiring structure another two-layered wiring structure is formed on the first two-layered wiring structure. Further, it is also possible to use the Cu wiring line even when the Cu wiring line is made of a conductive material containing trace amounts of other metals, provided that Cu is contained in the conductive material as its main component.

Further, as for materials of the metal mask, it is also possible to use other materials, for example TaN (tantalum nitride); Ti (titanium); WSi (tungsten silicide); and like, together with materials of the metal mask. Further, as for materials of the Cu diffusion barrier film, it is also possible to use other materials, for example P—SiC (plasma silicon carbide) and like, together with the materials of the Cu diffusion barrier film.

Still further, as for materials of the low dielectric constant film, it is also possible to use other materials, for example HSQ; organic SOG; porous silica; and like, together with materials of the low dielectric constant film. Further, as for materials of the insulation protective film, it is also possible to use other materials, for example P—SiN (plasma silicon nitride); P—SiON (plasma silicon oxynitride); P—SiC (plasma silicon carbide); and like, together with materials of the insulation protective film. Further, the film thickness of each of the various insulation films, the conductive films and like films having been described above are only illustrative examples. Further, film forming means and conditions described above are also only illustrative examples. Consequently, the film thickness, the materials, the film forming means and conditions described above may be changed if necessary.

Finally, the present application claims the Convention Priority based on Japanese Patent Application No. Hei 11-277563 filed on Sep. 29, 1999, which is herein incorporated by reference.

What is claimed is:

1. A method of manufacturing a semiconductor device comprising:

forming an underlying wiring line comprising copper in a semiconductor substrate;

forming an interlayer insulation film including a low dielectric constant film on said semiconductor substrate;

forming a metal mask on said interlayer insulation film;

subsequently forming a first photoresist film on said metal mask, wherein said first photoresist film is patterned to form a via hole;

forming a second photoresist film on said metal mask, wherein said second photoresist film is patterned to form an overlying wiring trench;

patterning said metal mask according to a pattern of each of said first photoresist film and said second photoresist film;

removing said first photoresist film and said second photoresist film prior to patterning of said interlayer insulation film, wherein said patterning is performed using said metal mask to form said via hole and said overlying wiring trench in said interlayer insulation film; and filling said overlying wiring trench and said via hole with a conductive material comprising copper to form an overlying wiring line and a via contact.

2. A method of manufacturing a semiconductor device comprising:

forming an underlying wiring line comprising copper in a semiconductor substrate;

forming an interlayer insulation film including a low dielectric constant film on said semiconductor substrate;

forming a metal mask on said interlayer insulation film;

forming a first photoresist film on said metal mask, and patterning said first photoresist film to have a pattern for forming a via hole;

removing said first photoresist film by an isotropic plasma ashing treatment after said metal mask is patterned to have a same pattern as that of said first photoresist film;

forming a second photoresist film on said metal mask, and patterning said second photoresist film to have a pattern for forming an overlying wiring trench;

removing said second photoresist film by an isotropic plasma ashing treatment after said metal mask is patterned to have a same pattern as that of said second photoresist film; and sequentially patterning said interlayer insulation film by using said metal mask to sequentially form said via hole and said overlying wiring trench; and filling said overlying wiring trench and said via hole with a conductive material comprising copper to form an overlying wiring line and a via contact.

3. A method of manufacturing a semiconductor device in which: an underlying wiring line made of copper or a conductive material containing copper as its main component is formed in a semiconductor substrate; after that, an interlayer insulation film including a low dielectric constant film is formed on said semiconductor substrate; an overlying wiring trench and a via hole are formed in said interlayer insulation film; and, said overlying wiring trench and said via hole are filled with copper or a conductive material containing copper as its main component to form an overlying wiring line and a via contact, the method comprising:

forming a metal mask on said interlayer insulation film, said metal mask being constructed of a multilayered element, said multilayered element comprising a first metal mask and a second metal mask;

forming a first photoresist film on said metal mask, and patterning said first photoresist film to have a pattern for forming said via hole;

removing said first photoresist film by an isotropic plasma ashing treatment after said first metal mask and said second metal mask are patterned to have a same pattern as that of said first photoresist film;

forming a second photoresist film on said metal mask, and patterning said second photoresist film to have a pattern for forming said overlying wiring trench;

removing said second photoresist film by an isotropic plasma ashing treatment after said second metal mask of said metal mask is patterned to have a same pattern as that of said second photoresist film; and sequentially patterning said interlayer insulation film by using said metal mask to sequentially form said via hole and said overlying wiring trench.

4. The method of manufacturing the semiconductor device, according to claim 2, wherein said forming of said interlayer insulation film comprises:

forming a Cu diffusion barrier film on said underlying wiring line;

forming said low dielectric constant film on said Cu diffusion barrier film; and forming an insulation protective film on said low dielectric constant film.

5. The method of manufacturing the semiconductor device, according to claim 3, wherein said forming of said interlayer insulation film comprises:

forming a Cu diffusion barrier film on said underlying wiring line;

forming said low dielectric constant film on said Cu diffusion barrier film; and forming an insulation protective film on said low dielectric constant film.

6. The method of manufacturing the semiconductor device, according to claim 2, wherein said metal mask is made of at least one material selected from a group consisting of: tungsten nitride; tantalum; tungsten; tantalum nitride; titanium; titanium nitride; and, tungsten silicide.

7. The method of manufacturing the semiconductor device, according to claim 3, wherein said metal mask is made of at least one material selected from a group consisting of: tungsten nitride; tantalum; tungsten; tantalum nitride; titanium; titanium nitride; and, tungsten silicide.

8. The method of manufacturing the semiconductor device, according to claim 4, wherein said metal mask is made of at least one material selected from a group consisting of: tungsten nitride; tantalum; tungsten; tantalum nitride; titanium; titanium nitride; and, tungsten silicide.

9. The method of manufacturing the semiconductor device, according to claim 5, wherein said metal mask is made of at least one material selected from a group consisting of: tungsten nitride; tantalum; tungsten; tantalum nitride; titanium; titanium nitride; and, tungsten silicide.

10. The method of manufacturing the semiconductor device, according to claim 4, wherein said Cu diffusion barrier film is made of at least one material selected from a group consisting of: plasma silicon nitride; and, plasma silicon carbide.

11. The method of manufacturing the semiconductor device, according to claim 5, wherein said Cu diffusion barrier film is made of at least one material selected from a group consisting of: plasma silicon nitride; and, plasma silicon carbide.

12. The method of manufacturing the semiconductor device, according to claim 2, wherein said low dielectric constant film is made of at least one material selected from a group consisting of: organic polymer; HSQ(Hydrogen Silsesguioxane); organic SOG(Spin on Glass); and, porous silica.

13. The method of manufacturing the semiconductor device, according to claim 3, wherein said low dielectric constant film is made of at least one material selected from a group consisting of: organic polymer; HSQ(Hydrogen Silsesquioxane); organic SOG(Spin on Glass); and, porous silica.

14. The method of manufacturing the semiconductor device, according to claim 4, wherein said low dielectric constant film is made of at least one material selected from a group consisting of: organic polymer; HSQ(Hydrogen Silsesquioxane); organic SOG(Spin on Glass); and, porous silica.

15. The method of manufacturing the semiconductor device, according to claim 5, wherein said low dielectric constant film is made of at least one material selected from a group consisting of: organic polymer; HSQ(Hydrogen Silsesquioxane); organic SOG(Spin on Glass); and, porous silica.

16. The method of manufacturing the semiconductor device, according to claim 2, further comprising an insulation protective film formed on said low dielectric constant film, wherein said insulation protective film is made of at least one material selected from a group consisting of: plasma silicon oxide; plasma silicon nitride; plasma silicon oxynitride; and, plasma silicon carbide.

17. The method of manufacturing the semiconductor device, according to claim 3, further comprising an insulation protective film formed on said low dielectric constant film, wherein said insulation protective film is made of at least one material selected from a group consisting of: plasma silicon oxide; plasma silicon nitride; plasma silicon oxynitride; and, plasma silicon carbide.

18. The method of manufacturing the semiconductor device, according to claim 4, wherein said insulation protective film is made of at least one material selected from a group consisting of: plasma silicon oxide; plasma silicon nitride; plasma silicon oxynitride; and, plasma silicon carbide.

19. The method of manufacturing the semiconductor device, according to claim 5, wherein said insulation protective film is made of at least one material selected from a group consisting of: plasma silicon oxide; plasma silicon nitride; plasma silicon oxynitride; and, plasma silicon carbide.

20. The method of manufacturing the semiconductor device according to claim 1, wherein said metal mask comprises a first metal mask and a second metal mask.

21. The method of manufacturing the semiconductor device according to claim 2, wherein said metal mask comprises a first metal mask and a second metal mask.

* * * * *